United States Patent
Lee et al.

(10) Patent No.: US 12,119,802 B2
(45) Date of Patent: Oct. 15, 2024

(54) RADIO FREQUENCY TRANSCEIVER DEVICE

(71) Applicant: REALTEK SEMICONDUCTOR CORP., Hsinchu (TW)

(72) Inventors: Chia-Yi Lee, Hsinchu (TW); Kuan-Yu Shih, Hsinchu (TW); Chia-Jun Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 357 days.

(21) Appl. No.: 17/830,970

(22) Filed: Jun. 2, 2022

(65) Prior Publication Data

US 2023/0198492 A1 Jun. 22, 2023

(30) Foreign Application Priority Data

Dec. 22, 2021 (TW) .................................. 110148297

(51) Int. Cl.
*H03H 7/38* (2006.01)
*H03F 3/19* (2006.01)
*H04B 1/44* (2006.01)

(52) U.S. Cl.
CPC ................. *H03H 7/38* (2013.01); *H03F 3/19* (2013.01); *H04B 1/44* (2013.01); *H03F 2200/294* (2013.01)

(58) Field of Classification Search
CPC ....... H03H 7/38; H03F 3/19; H03F 2200/294; H04B 1/44
See application file for complete search history.

(56) References Cited

U.S. PATENT DOCUMENTS

| 9,413,431 | B2* | 8/2016 | Chang | H04B 5/72 |
| 2006/0135084 | A1* | 6/2006 | Lee | H04B 1/18 |
| | | | | 455/78 |
| 2014/0273887 | A1* | 9/2014 | Black | H04B 1/18 |
| | | | | 455/77 |
| 2016/0080018 | A1* | 3/2016 | Sankaranarayanan | ........................ |
| | | | | H04B 17/21 |
| | | | | 375/351 |
| 2018/0041875 | A1* | 2/2018 | Saig | H04W 4/06 |
| 2021/0067183 | A1* | 3/2021 | Abbasi | H03F 1/565 |

FOREIGN PATENT DOCUMENTS

TW    I733166 B    7/2021

* cited by examiner

*Primary Examiner* — Raymond S Dean
(74) *Attorney, Agent, or Firm* — Birch, Stewart, Kolasch & Birch, LLP (57) ABSTRACT

A radio frequency transceiver device includes an antenna unit, a first matching circuit, a receiver circuit, a second matching circuit, a transmitter circuit, and an auxiliary circuit. The receiver circuit includes a mixer unit. The auxiliary circuit includes a first transformer coil and a second transformer coil. The first matching circuit and the receiver circuit are configured to form a first signal reception channel to receive, process, and transmit the first radio frequency signal to the mixer unit when the first radio frequency signal is a high gain radio frequency signal. The second matching circuit and the auxiliary circuit are configured to form a second signal reception channel to receive, process, and transmit the first radio frequency signal to the mixer unit when the first radio frequency signal is a middle-low gain radio frequency signal. Another radio frequency signal transceiver device further includes a third matching circuit.

15 Claims, 4 Drawing Sheets

RADIO FREQUENCY TRANSCEIVER DEVICE

CROSS-REFERENCE TO RELATED APPLICATION

This non-provisional application claims priority under 35 U.S.C. § 119(a) to Patent Application 110148297 filed in Taiwan, R.O.C. on Dec. 22, 2021, the entire contents of which are hereby incorporated by reference.

BACKGROUND

Technical Field

The instant disclosure is related to wireless radio frequency circuit technology, especially a transceiver circuit having an auxiliary circuit coupled to a receiver circuit and a transmitter circuit.

Related Art

A wireless radio frequency circuit known to the inventor includes a transmitter circuit and a receiver circuit. In order to cover a wide power range, the receiver circuit of the wireless radio frequency circuit known to the inventor is often designed to have multiple gain attenuation circuits. However, when different gain configurations are designed, the linearity of the receiver circuits may be limited by the off-state attenuation circuits on the signal path. When a receiver circuit receives a signal with larger power, the off-state attenuation circuits will be affected by signal swings, leading to the decrease of the linearity of the receiver circuits. Especially, this phenomenon occurs even more easily when the received signal is a middle gain signal.

SUMMARY

In view of this, some embodiments of the instant disclosure provide a radio frequency transceiver device comprising an antenna unit, a first matching circuit, a receiver circuit, a second matching circuit, a transmitter circuit, and an auxiliary circuit. The antenna unit is configured to receive a first radio frequency signal or transmit a second radio frequency signal. The first matching circuit is coupled to the antenna unit. The receiver circuit is coupled to the first matching circuit and comprises a mixer unit. The second matching circuit is coupled to the antenna unit. The transmitter circuit is coupled to the second matching circuit. The second matching circuit and the transmitter circuit form a signal transmission channel configured to transmit the second radio frequency signal. The auxiliary circuit comprises a first transformer coil and a second transformer coil, where the first transformer coil is coupled between the second matching circuit and the transmitter circuit, and the second transformer coil is coupled to the mixer unit. The first matching circuit and the receiver circuit are configured to form a first signal reception channel. When the first radio frequency signal is a high gain radio frequency signal, the first signal reception channel receives and processes the first radio frequency signal and then transmits the first radio frequency signal to the mixer unit. The second matching circuit and the auxiliary circuit are configured to form a second signal reception channel. When the first radio frequency signal is a middle-low gain radio frequency signal, the second signal reception channel receives the first radio frequency signal and then transmits the first radio frequency signal to the mixer unit.

Some embodiments in the instant disclosure provide a radio frequency transceiver device comprising an antenna unit, a first matching circuit, a receiver circuit, a second matching circuit, a transmitter circuit, a third matching circuit, and an auxiliary circuit. The antenna unit is configured to receive a first radio frequency signal or transmit a second radio frequency signal. The first matching circuit is coupled to the antenna unit. The receiver circuit is coupled to the first matching circuit and comprises a mixer unit. The second matching circuit is coupled to the antenna unit. The transmitter circuit is coupled to the second matching circuit. The second matching circuit and the transmitter circuit form a signal transmission channel configured to transmit the second radio frequency signal. The third matching circuit is coupled to the antenna unit. The auxiliary circuit comprises a first transformer coil and a second transformer coil, where the first transformer coil is coupled to the third matching circuit, and the second transformer coil is coupled to the mixer unit. The first matching circuit and the receiver circuit are configured to form a first signal reception channel. When the first radio frequency signal is a high gain radio frequency signal, the first signal reception channel receives and processes the first radio frequency signal and then transmits the first radio frequency signal to the mixer unit. The third matching circuit and the auxiliary circuit are configured to form a second signal reception channel. When the first radio frequency signal is a middle-low gain radio frequency signal, the second signal reception channel receives the first radio frequency signal and then transmits the first radio frequency signal to the mixer unit.

Based on the above, in the radio frequency transceiver device according to some embodiments of the instant disclosure, in order to increase the linearity of the receiver circuit, the auxiliary circuit and one of the matching circuits are applied to receive middle-low gain radio frequency signals in the signal receiving mode, so that the linearity of the receiver circuit is increased, and the design of the radio frequency transceiver device can be more flexible. In some embodiments of the instant disclosure, because the auxiliary circuit comprises a first transformer coil and a second transformer coil, the auxiliary circuit can be viewed as a first-stage circuit with a gain, as appropriate turns ratio of the first transformer coil to the second transformer coil according to requirements are designed, thereby reducing the noise figure of the device.

BRIEF DESCRIPTION OF THE DRAWINGS

The disclosure will become more fully understood from the detailed description given herein below for illustration only, and thus not limitative of the disclosure, wherein:

FIG. 5-1 illustrates a schematic diagram of equivalent impedances of circuits of the radio frequency transceiver device according to an embodiment of the instant disclosure:

FIG. 5-2 illustrates a schematic diagram of equivalent impedances of circuits of the radio frequency transceiver device according to an embodiment of the instant disclosure.

DETAILED DESCRIPTION

The foregoing and other technical contents, features, and effects of the present invention can be clearly presented below in detailed description with reference to embodiments of the accompanying drawings. Thicknesses or sizes of the elements in the drawings expressed in an exaggerated, omitted or general manner are used to help a person skilled in the art to understand and read, and the size of each element is not a completely actual size and is not intended to limit restraint conditions under which the present invention can be implemented and therefore have no technical significance. Any modification to the structure, change to the proportional relationship or adjustment on the size should fall within the scope of the technical content disclosed by the present invention without affecting the effects and the objectives that can be achieved by the present invention. In the following detailed description, the terms "couple" or "connect" may refer to any direct or indirect connection.

Figure 1:
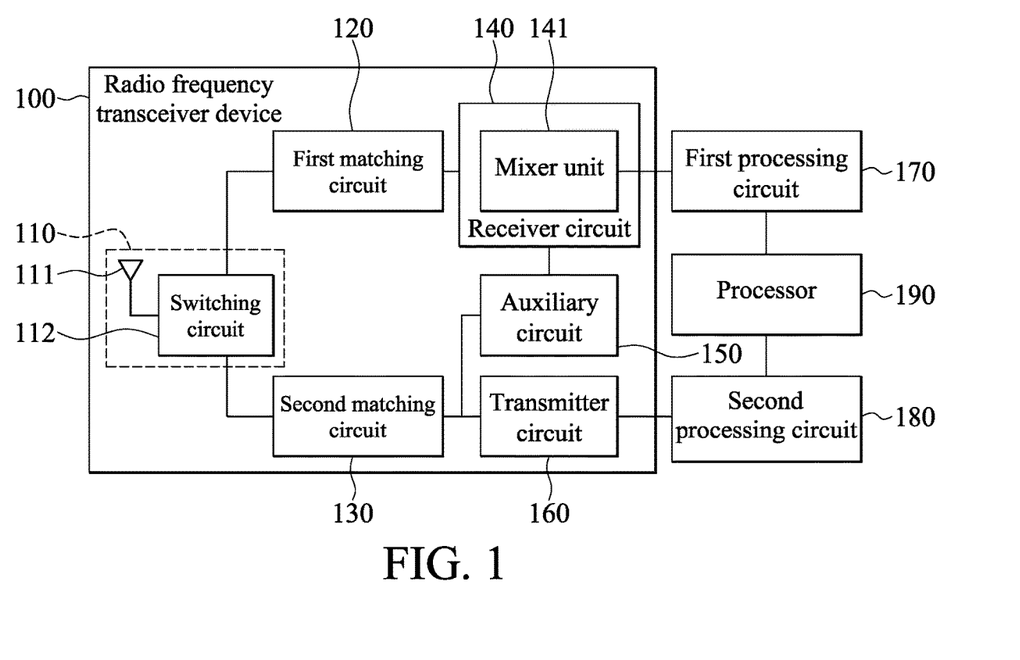
FIG. 1 illustrates a block diagram of a radio frequency transceiver device and a back-end circuit according to an embodiment of the instant disclosure.
Figure 2:
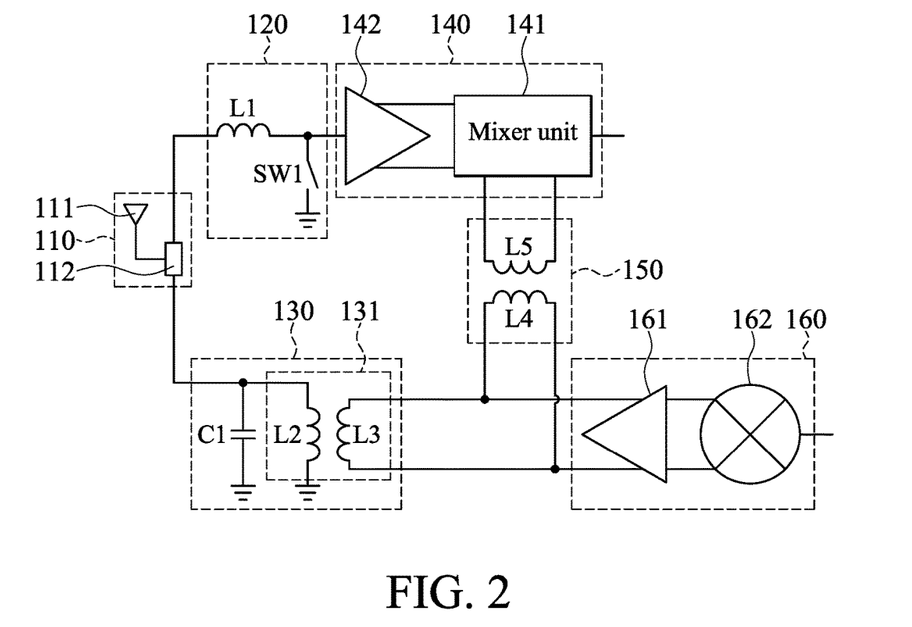
FIG. 2 illustrates a circuit diagram of a radio frequency transceiver device according to an embodiment of the instant disclosure.

FIG. 1 illustrates a block diagram of a radio frequency transceiver device and a back-end circuit according to an embodiment of the instant disclosure. FIG. 2 illustrates a circuit diagram of a radio frequency transceiver device according to an embodiment of the instant disclosure. Please refer to both FIG. 1 and FIG. 2. In this embodiment, a radio frequency transceiver device 100 comprises an antenna unit 110, a first matching circuit 120, a receiver circuit 140, a second matching circuit 130, a transmitter circuit 160, and an auxiliary circuit 150. The antenna unit 110 comprises an antenna 111 and a switching circuit 112. The antenna 111 is coupled to the switching circuit 112. The switching circuit 112 is configured to switch the operation mode of the antenna unit 110 between a signal receiving mode and a signal transmitting mode so as to receive a first radio frequency signal or transmit a second radio frequency signal.

In this embodiment, after the radio frequency transceiver device 100 receives the first radio frequency signal, the radio frequency transceiver device 100 moderately amplifies the first radio frequency signal according to the strength of the first radio frequency signal. According to the magnitude of the gain for amplifying the first radio frequency signal, the first radio frequency signals can be categorized into three types: high gain radio frequency signals, middle gain radio frequency signals, and low gain radio frequency signals. The strength of a low gain radio frequency signal is above −30 dBm, the strength of a middle gain radio frequency signal is between −50 and −30 dBm, and the strength of a high gain radio frequency signal is below −50 dBm. The term "middle-low gain radio frequency signal" may refer to either a middle gain radio frequency signal or a low gain radio frequency signal.

It should be noted that the abovementioned ranges are only adopted in this embodiment and not meant to limit the scope the instant disclosure. Any categorization approach where the first radio frequency signals are categorized into high, middle, and low gain radio frequency signals according to the amplification gains for the first radio frequency signals falls within the scope of the instant disclosure.

The first matching circuit 120 is coupled to the antenna unit 110. The receiver circuit 140 is coupled to the first matching circuit 120. The first matching circuit 120 is configured to transmit the signals from the antenna unit 110 to the receiver circuit 140 in a most efficient manner. Hence, during the signal transmission, signal reflections can be avoided as much as possible.

The receiver circuit 140 comprises a mixing unit 141. The mixing unit 141 is configured to receive the first radio frequency signal transmitted from the receiver circuit 140, downconvert the first radio frequency signal to the fundamental frequency, and perform demodulation on the first radio frequency signal to generate differential signals: an analog I signal and an analog Q signal. The analog I signal and the analog Q signal, demodulated from the first radio frequency signal, are transmitted to a first processing circuit 170. The processing unit 170 converts the analog I signal and the analog Q signal into a digital I signal and a digital Q signal, which are transmitted to a processor 190 for signal processing.

In this embodiment, the first processing circuit 170 comprises an analog-to-digital conversion circuit so as to convert analog signals into digital signals. The second matching circuit 130 is coupled to the antenna unit 110. The transmitter circuit 160 is coupled to the second matching circuit 130, where the second matching circuit 130 and the transmitter circuit 160 form a signal transmission channel. When the radio frequency transceiver device 100 is in the signal transmitting mode, the processor 190 at the back end encodes the to-be-transmitted digital signals as a digital I signal and a digital Q signal and then transmits the digital I signal and the digital Q signal to a second processing circuit 180. The second processing circuit 180 converts the digital I signal and the digital Q signal into an analog I signal and an analog Q signal and then transmits the analog I signal and the analog Q signal to the transmitter circuit 160. The transmitter circuit 160 generates a second radio frequency signal based on the analog signals and then transmits the second radio frequency signal through the second matching circuit 130 and the antenna unit 110 in order.

In this embodiment, the second processing circuit 180 comprises digital-to-analog conversion circuit so as to convert digital signals into analog signals.

The signal transmission channel is configured to transmit the second radio frequency signal from the second processing circuit 180 and the processor 190. The second matching circuit 130 is configured to transmit the signals from the antenna unit 110 to the transmitter circuit 160 in a most efficient manner. Hence, during the signal transmission, signal reflections can be avoided as much as possible.

In order to reduce the problem of lowered linearity, in this embodiment, the auxiliary circuit 150 is provided. The auxiliary circuit 150 comprises a first transformer coil L4 and a second transformer coil L5. The first transformer coil L4 is coupled between the second matching circuit 130 and the transmitter circuit 160, and the second transformer coil L5 is coupled to the mixer unit 141. The first matching circuit 120 and the receiver circuit 140 are configured to form a first signal reception channel. When the first radio frequency signal is a high gain radio frequency signal, the first signal reception channel receives and processes the first radio frequency signal and then transmits the first radio frequency signal to the mixer unit 141. The second matching circuit 130 and the auxiliary circuit 150 are configured to form a second signal reception channel. When the first radio frequency signal is a middle-low gain radio frequency signal, the second signal reception channel receives the first radio frequency signal and then transmits the first radio frequency signal to the mixer unit 141. Because no switching element exists on the path of the second signal reception channel for middle-low gain radio frequency signal transmission, signals are not affected by off-state switching elements. As a result, the linearity of the receiver circuit 140 can be increased. Besides, in this embodiment, the auxiliary circuit can be viewed as a first-stage circuit with a gain, as appropriate turns ratio of the first transformer coil to the second transformer coil according to requirements are designed, thereby reducing the noise figure of the device.

Please refer to FIG. 2. In an embodiment of the instant disclosure, the receiver circuit 140 further comprises a low-noise amplifier 142. The low-noise amplifier 142 is coupled to the first matching circuit 120 to receive the first radio frequency signal transmitted from the first matching circuit 120. In this embodiment, when the first radio frequency signal is a high gain radio frequency signal, the low-noise amplifier 142 is configured to amplify the first radio frequency signal.

Please refer to FIG. 2. In an embodiment of the instant disclosure, the first matching circuit 120 further comprises an inductor L1 and a switching element SW1. The inductor L1 is coupled to the antenna unit 110 and the low-noise amplifier 142. The switching element SW1 has a first end and a second end, where the first end of the switching element SW1 is coupled between the inductor L1 and the low-noise amplifier 142, and the second end of the switching element SW1 is coupled to a ground. The switching element SW1 is configured to be turned off when the first radio frequency signal is a high gain radio frequency signal, so that the inductor L1 and the low-noise amplifier 142 form the first signal reception channel to receive and process the first radio frequency signal. The switching element SW1 is configured to be turned on and the low-noise amplifier 142 is configured to be turned off when the first radio frequency signal is a middle-low gain radio frequency signal, so that the second matching circuit 130 and the auxiliary circuit 150 form the second signal reception channel to receive and process the first radio frequency signal.

When the radio frequency transceiver device 100 is in the signal transmitting mode, because the power of the second radio frequency signal is larger, the switching element SW1 is configured to be turned on so as to conduct residual power to the ground in order to keep the higher-power second radio frequency signal from influencing the low-noise amplifier 142 of the receiver circuit 140, thereby protecting the low-noise amplifier 142 of the receiver circuit 140.

Please refer to FIG. 2. In an embodiment of the instant disclosure, the second matching circuit 130 further comprises a capacitor C1 and an inductor pair 131. The capacitor C1 is coupled to the antenna unit 110 and a ground; the inductor pair 131 comprises an inductor L2 and an inductor L3. The inductor L2 is shunted with the capacitor C1 and coupled to the antenna unit 110 and the ground, and the inductor L3 is coupled to the transmitter circuit 160 and the first transformer coil L4 of the auxiliary circuit 150. The inductor pair 131 is used as a part of the second signal receiving channel in the signal receiving mode to convert single-ended signals into differential signals. Such conversion halves the strength of the signals and thus increases the linearity. The inductor pair 131 is used to convert differential signals into single-ended signals in the signal transmitting mode.

Please refer to both FIG. 1 and FIG. 2. When the radio frequency transceiver device 100 is in the signal receiving mode and the first radio frequency signal is a high gain radio frequency signal, the processor 190 controls the switching element SW1 to be turned off, and the processor 190 also controls the low-noise amplifier 142 to be turned on. As a result, the inductor L1, the low-noise amplifier 142, and the mixer unit 141 form a first signal reception channel to receive and process the first radio frequency signal. When the first radio frequency signal is a middle-low gain radio frequency signal, the processor 190 controls the switching element SW1 to be turned on, and the processor 190 also controls the low-noise amplifier 142 to be turned off. As a result, the capacitor C1, the inductor L2, the inductor L3, the first transformer coil L4 of the auxiliary circuit 150, and the second transformer coil L5 of the auxiliary circuit 150 form a second signal reception channel to receive and process the first radio frequency signal. On the other hand, when the radio frequency transceiver device 100 is in the signal transmitting mode, the processor 190 controls the switching element SW1 to be turned on. As a result, the transmitter circuit 160, the inductor L3, the inductor L2, and the capacitor C1 form a signal transmission channel to transmit the second radio frequency. The second radio frequency signal is then transmitted outward through the antenna unit 110.

In an embodiment of the instant disclosure, the transmitter circuit 160 comprises a power amplifier 161 and a mixer circuit 162. Because the operational detail of the transmitter circuit 160 is not the focus of the present invention, it will not be illustrated further in the instant disclosure.

Figure 3:
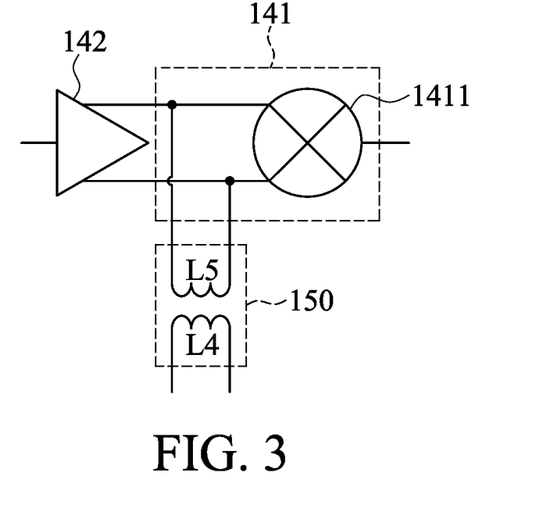
FIG. 3 illustrates a circuit diagram of a mixer unit according to an embodiment of the instant disclosure.

FIG. 3 illustrates a circuit diagram of a mixer unit according to an embodiment of the instant disclosure. Please refer to FIG. 3. The mixer unit 141 comprises a mixer 1411. The mixer 1411 is coupled to the low-noise amplifier 142 and the second transformer coil L5 of the auxiliary circuit 150 is coupled between the mixer 1411 and the low-noise amplifier 142. Therefore, in this embodiment, when the first radio frequency signal is a high gain radio frequency signal, the mixer 1411 is used to receive the first radio frequency signal from the first signal reception channel, downconvert the first radio frequency signal to the fundamental frequency, and performs demodulation on the first radio frequency signal to generate differential signals: an analog I signal and an analog Q signal. When the first radio frequency signal is a middle-low gain radio frequency signal, the mixer 1411 is used to receive the first radio frequency signal from the second signal reception channel, downconvert the first radio frequency signal to the fundamental frequency, and performs demodulation on the first radio frequency signal to generate differential signals: an analog I signal and an analog Q signal.

Figure 4:
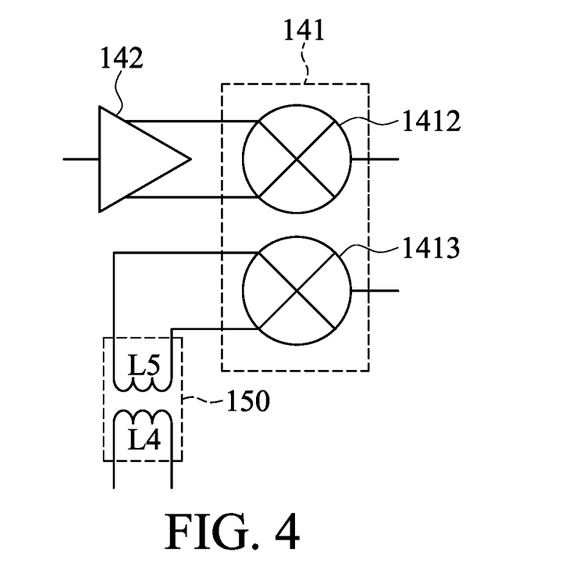
FIG. 4 illustrates a circuit diagram of another mixer unit according to an embodiment of the instant disclosure.

FIG. 4 illustrates a circuit diagram of another mixer unit according to an embodiment of the instant disclosure. Please refer to FIG. 4. The mixer unit 141 comprises two individual mixers 1412, 1413. The mixer 1412 is coupled to the low-noise amplifier 142, and the mixer 1413 is coupled to the second transformer coil L5 of the auxiliary circuit 150. In this embodiment, two independent mixers 1412 and 1413 are provided so that when the first radio frequency signal is a high gain radio frequency signal, the mixer 1412 is used to receive the first radio frequency signal from the first signal reception channel, downconvert the first radio frequency signal to the fundamental frequency, and perform demodulation on the first radio frequency signal to generate differential signals: an analog I signal and an analog Q signal; and when the first radio frequency signal is a middle-low gain radio frequency signal, the mixer 1413 is configured to receive the first radio frequency signal from the second signal reception channel, downconvert the first radio frequency signal to the fundamental frequency, and perform demodulation on the first radio frequency signal to generate differential signals: an analog I signal and an analog Q signal. Such a configuration allows the actual implementation of the mixer 1412 and mixer 1413 to use different structures of mixer circuits depending on the design requirements. For example, using a switching mixer or using an active mixer to provide additional gain.

FIG. 5-1 and FIG. 5-2 illustrate schematic diagrams of equivalent impedances of circuits of the radio frequency transceiver device according to some embodiments of the instant disclosure. Please refer to FIG. 1, FIG. 2, FIG. 5-1, and FIG. 5-2. In an embodiment, the turns ratio of the first transformer coil L4 to the second transformer coil L5 is determined by a first impedance $Z_{in1}$ and a second impedance $Z_{in2}$, where the first impedance $Z_{in1}$ is an equivalent impedance looking into the transmitter circuit 160 seen by the first transformer coil L4, and the second impedance $Z_{in2}$ is the equivalent impedance looking into the mixer unit 141 seen by the second transformer coil L5.

Figure 51:
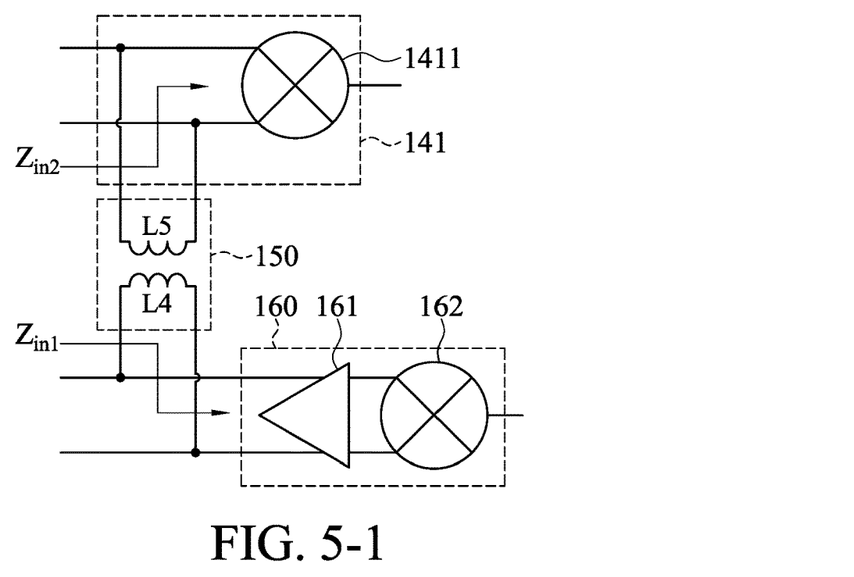

For the embodiment shown in FIG. 3 (please refer to FIG. 5-1), the first impedance $Z_{in1}$ is an equivalent impedance looking into the input end of the power amplifier 161 of the transmitter circuit 160 seen by the first transformer coil L4, and the second impedance $Z_{in2}$ is the equivalent impedance looking into the mixer 1411 of the mixer unit 141 seen by the second transformer coil L5.

Figure 52:
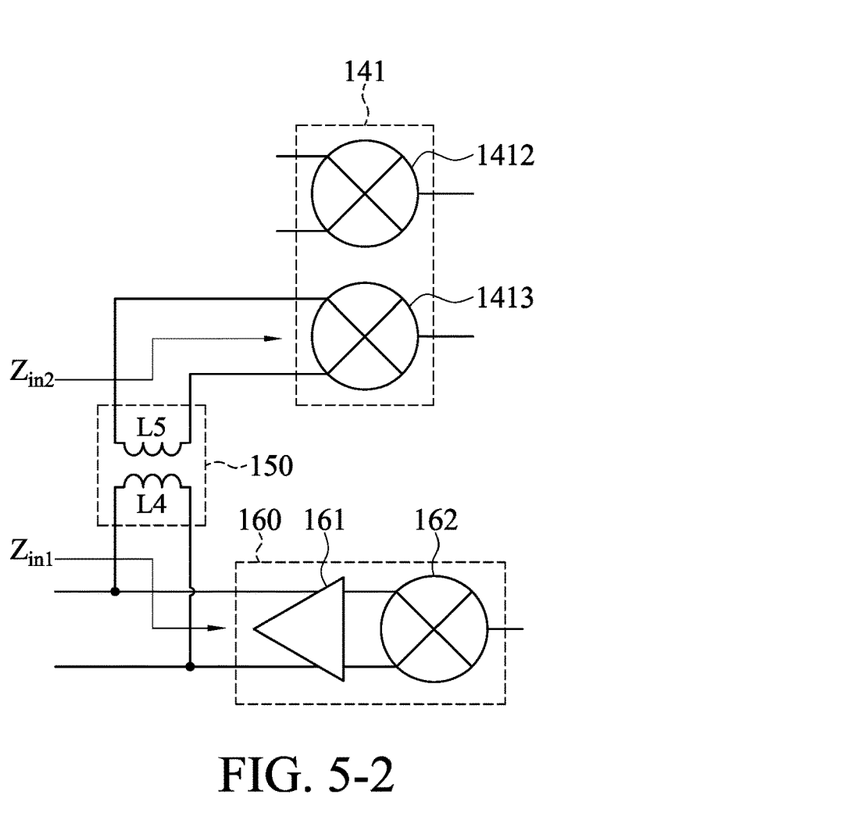

For an embodiment shown in FIG. 4 (please refer to FIG. 5-2), the first impedance $Z_{in1}$ is an equivalent impedance looking into the input end of the power amplifier 161 of the transmitter circuit 160 seen by the first transformer coil L4, and the second impedance $Z_{in2}$ is the equivalent impedance looking into the mixer 1413 of the mixer unit 141 seen by the second transformer coil L5.

In an embodiment of the instant disclosure, the turns ratio of the first transformer coil L4 to the second transformer coil L5 may be determined by the following equation:

$$\frac{N_1}{N_2} = \sqrt{\frac{Z_{in1}}{Z_{in2}}}, \quad \text{(Eq. 1)}$$

where $N_1$ denotes a number of turns of the first transformer coil L4, and $N_2$ denotes a number of turns of the second transformer coil L5.

In this embodiment, according to the turns ratio of the first transformer coil L4 to the second transformer coil L5 described in Eq. 1, the low impedance of the output end of the power amplifier 161 on the second signal reception channel can be matched with the high impedance of the input end of the mixer 1411 (or the mixer 1413). Furthermore, because of the turns ratio of the first transformer coil L4 to the second transformer coil L5 described in Eq. 1, the auxiliary circuit 150 can be viewed as a first-stage circuit with a gain, thereby reducing the noise figure of the device.

Figure 6:
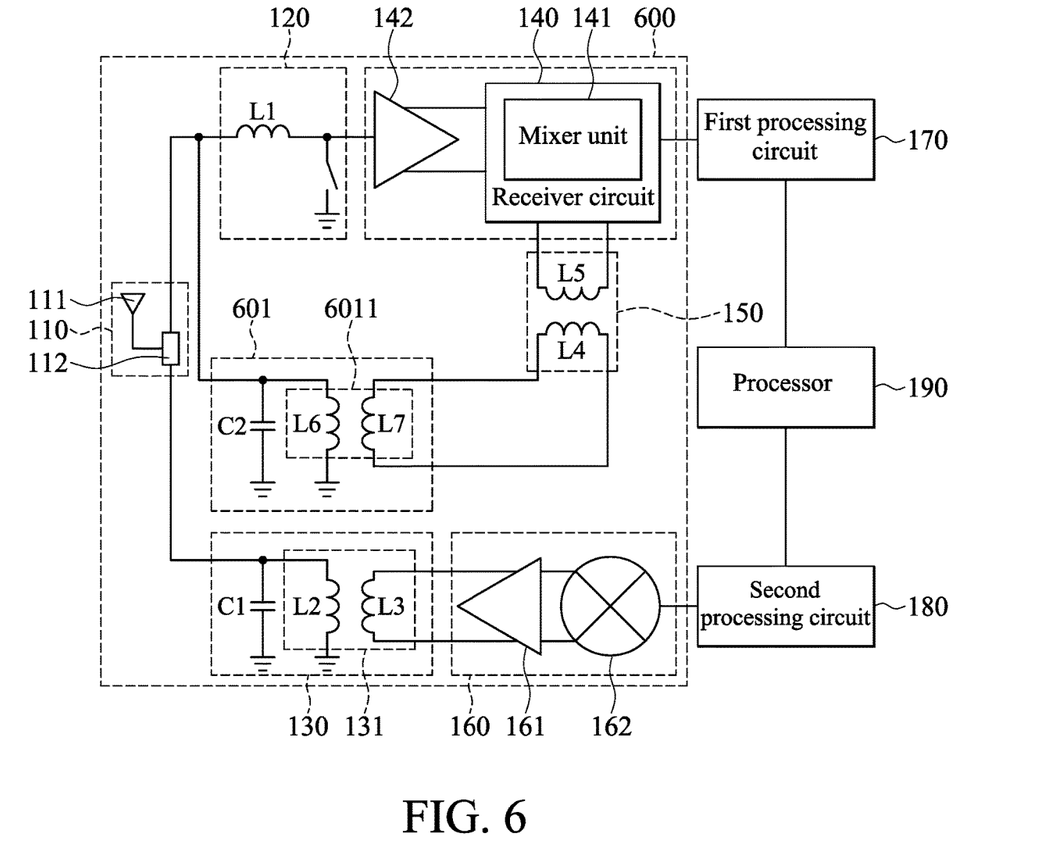
FIG. 6 illustrates a block diagram of a radio frequency transceiver device and a back-end circuit according to an embodiment of the instant disclosure.

FIG. 6 illustrates a block diagram of a radio frequency transceiver device and a back-end circuit according to an embodiment of the instant disclosure. Please refer to FIG. 6. Compared with the radio frequency transceiver device 100 shown in FIG. 1, the radio frequency transceiver device 600 shown in FIG. 6 further comprises a third matching circuit 601. The third matching circuit 601 is coupled to the antenna unit 110. The first transformer L4 of the auxiliary circuit 150 shown in FIG. 6 is coupled to the third matching circuit 601 instead of the second matching circuit 130. In this embodiment, the third matching circuit 601 and the second matching circuit 130 have the same circuit structure. The third matching circuit 601 comprises a capacitor C2 and an inductor pair 6011 in the same circuit structure as the second matching circuit 130. The capacitor C2 is coupled to the antenna unit 110 and a ground, and the inductor pair 6011 comprises an inductor L6 and an inductor L7. The inductor L6 is shunted with the capacitor C2 and coupled to the antenna unit 110 and the ground, and the inductor L7 is coupled to the first transformer coil L4 of the auxiliary circuit 150. The inductor pair 6011 is used to convert single-ended signals into differential signals in the signal receiving mode.

The first matching circuit 120 and the receiver circuit 140 are configured to form a first signal reception channel. When the first radio frequency signal is a high gain radio frequency signal, the first signal reception channel receives and processes the first radio frequency signal and then transmits the first radio frequency signal to the mixer unit 141. The third matching circuit 601 and the auxiliary circuit 150 are configured to form a second signal reception channel. When the first radio frequency signal is a middle-low gain radio frequency signal, the second signal reception channel receives the first radio frequency signal and then transmits the first radio frequency signal to the mixer unit 141.

The various embodiments of the first matching circuit 120, the receiver circuit 140, the mixer unit 141, the transmitter circuit, the second matching circuit 130, and the auxiliary circuit 150 of the radio frequency transceiver device 600 are identical to those of the radio frequency transceiver device 100. Detailed illustrations for these components can be referred to the abovementioned embodiments.

In an embodiment of the instant disclosure, when the radio frequency transceiver device 600 is in the signal receiving mode and the first radio frequency signal is a high gain radio frequency signal, the processor 190 controls the switching element SW1 to be turned off, and the processor 190 also controls the low-noise amplifier 142 to be turned on. As a result, the inductor L1, the low-noise amplifier 142 and the mixer unit 141 form a first signal reception channel to receive and process the first radio frequency signal. When the first radio frequency signal is a middle-low gain radio frequency signal, the processor 190 controls the switching element SW1 to be turned on, and the processor 190 also controls the low-noise amplifier 142 to be turned off. As a result, the capacitor C2, the inductor L6, the inductor L7, the first transformer coil L4 of the auxiliary circuit 150, and the second transformer coil L5 of the auxiliary circuit 150 form a second signal reception channel to receive and process the first radio frequency signal. On the other hand, when the radio frequency transceiver device 600 is in the signal transmitting mode, the processor 190 controls the switching element SW1 to be turned on. As a result, the transmitter circuit 160, the inductor L3, the inductor L2, and the capacitor C1 form a signal transmission channel to transmit the second radio frequency signal. The second radio frequency signal is then transmitted outward through the antenna unit 110.

It should be noted that, although the third matching circuit 601 and the second matching circuit 130 have the same circuit structure in this embodiment, the third matching circuit 601 may be designed differently from the second matching circuit 130 according to actual requirements; embodiments are not limited thereto.

Although the present invention has been described in considerable detail with reference to certain preferred embodiments thereof, the invention is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A radio frequency transceiver device comprising:
   an antenna unit configured to receive a first radio frequency signal or transmit a second radio frequency signal;
   a first matching circuit coupled to the antenna unit;
   a receiver circuit coupled to the first matching circuit and comprising a mixer unit;
   a second matching circuit coupled to the antenna unit;
   a transmitter circuit coupled to the second matching circuit, wherein the second matching circuit and the transmitter circuit form a signal transmission channel configured to transmit the second radio frequency signal; and
   an auxiliary circuit comprising a first transformer coil and a second transformer coil, wherein the first transformer coil is coupled between the second matching circuit and the transmitter circuit, and the second transformer coil is coupled to the mixer unit;
   wherein the first matching circuit and the receiver circuit are configured to form a first signal reception channel: when the first radio frequency signal is a high gain radio frequency signal, the first signal reception channel receives and processes the first radio frequency signal and then transmits the first radio frequency signal to the mixer unit; the second matching circuit and the auxiliary circuit are configured to form a second signal reception channel: when the first radio frequency signal is a middle-low gain radio frequency signal, the second signal reception channel receives the first radio frequency signal and then transmits the first radio frequency signal to the mixer unit.

2. The radio frequency transceiver device according to claim 1, wherein a turns ratio of the first transformer coil to the second transformer coil is determined by a first impedance and a second impedance: the first impedance is the equivalent impedance looking into the transmitter circuit seen by the first transformer coil, and the second impedance is the equivalent impedance looking into the mixer unit seen by the second transformer coil.

3. The radio frequency transceiver device according to claim 2, wherein the turns ratio is the square root of the ratio of the first impedance to the second impedance.

4. The radio frequency transceiver device according to claim 1, wherein the receiver circuit further comprises:
   a low-noise amplifier coupled to the first matching circuit, wherein the low-noise amplifier is configured to receive and amplify the first radio frequency signal matched by the first matching circuit when the first radio frequency signal is the high gain radio frequency signal.

5. The radio frequency transceiver device according to claim 4, wherein the mixer unit comprises a first mixer coupled to the low-noise amplifier, and the second transformer coil is coupled between the first mixer and the low-noise amplifier.

6. The radio frequency transceiver device according to claim 4, wherein the mixer unit comprises a first mixer and a second mixer, the first mixer is coupled to the low-noise amplifier, and the second mixer is coupled to the second transformer coil.

7. The radio frequency transceiver device according to claim 4, wherein the first matching circuit further comprises:
   a first inductor coupled to the antenna unit and the low-noise amplifier; and
   a switching element having a first end and a second end, wherein the first end of the switching element is coupled between the first inductor and the low-noise amplifier, and the second end of the switching element is coupled to a ground;
   wherein, the switching element is configured to be turned off when the first radio frequency signal is the high gain radio frequency signal, so that the first inductor and the low-noise amplifier form the first signal reception channel to receive and process the first radio frequency signal: the switching element is configured to be turned on and the low-noise amplifier is configured to be turned off when the first radio frequency signal is a middle-low gain radio frequency signal, so that the second matching circuit and the auxiliary circuit form the second signal reception channel to receive and process the first radio frequency signal.

8. The radio frequency transceiver device according to claim 4, wherein the second matching circuit further comprises:
   a capacitor coupled to the antenna unit and a ground; and
   an inductor pair comprising a second inductor and a third inductor, wherein the second inductor is shunted with the capacitor and coupled to the antenna unit and the ground, and the third inductor is coupled to the transmitter circuit and the first transformer coil of the auxiliary circuit.

9. A radio frequency transceiver device comprising:
   an antenna unit configured to receive a first radio frequency signal or transmit a second radio frequency signal;
   a first matching circuit coupled to the antenna unit;
   a receiver circuit coupled to the first matching circuit and comprising a mixer unit;
   a second matching circuit coupled to the antenna unit;
   a transmitter circuit coupled to the second matching circuit, wherein the second matching circuit and the transmitter circuit form a signal transmission channel configured to transmit the second radio frequency signal;
   a third matching circuit coupled to the antenna unit; and
   an auxiliary circuit comprising a first transformer coil and a second transformer coil, wherein the first transformer coil is coupled to the third matching circuit, and the second transformer coil is coupled to the mixer unit;
   wherein the first matching circuit and the receiver circuit are configured to form a first signal reception channel; when the first radio frequency signal is a high gain radio frequency signal, the first signal reception channel receives and processes the first radio frequency signal and then transmits the first radio frequency signal to the mixer unit; the third matching circuit and the auxiliary circuit are configured to form a second signal reception channel: when the first radio frequency signal is a middle-low gain radio frequency signal, the second signal reception channel receives the first radio frequency signal and then transmits the first radio frequency signal to the mixer unit.

10. The radio frequency transceiver device according to claim 9, wherein the receiver circuit further comprises:
    a low-noise amplifier coupled to the first matching circuit, wherein the low-noise amplifier is configured to receive and amplify the first radio frequency signal matched by the first matching circuit when the first radio frequency signal is the high gain radio frequency signal.

11. The radio frequency transceiver device according to claim 10, wherein the mixer unit comprises a first mixer coupled to the low-noise amplifier, and the second transformer coil is coupled between the first mixer and the low-noise amplifier.

12. The radio frequency transceiver device according to claim 10, wherein the mixer unit comprises a first mixer and a second mixer, the first mixer is coupled to the low-noise amplifier, and the second mixer is coupled to the second transformer coil.

13. The radio frequency transceiver device according to claim 10, wherein the first matching circuit further comprises:
a first inductor coupled to the antenna unit and the low-noise amplifier; and
a switching element having a first end and a second end, wherein the first end of the switching element is coupled between the first inductor and the low-noise amplifier, and the second end of the switching element is coupled to a ground;
wherein, the switching element is configured to be turned off when the first radio frequency signal is the high gain radio frequency signal, so that the first inductor and the low-noise amplifier form the first signal reception channel to receive and process the first radio frequency signal: the switching element is configured to be turned on and the low-noise amplifier is configured to be turned off when the first radio frequency signal is a middle-low gain radio frequency signal, so that the third matching circuit and the auxiliary circuit form the second signal reception channel to receive and process the first radio frequency signal.

14. The radio frequency transceiver device according to claim 10, wherein the second matching circuit further comprises:
a capacitor coupled to the antenna unit and a ground; and
an inductor pair comprising a second inductor and a third inductor, wherein the second inductor is shunted with the capacitor and coupled to the antenna unit and the ground, and the third inductor is coupled to the transmitter circuit and the first transformer coil of the auxiliary circuit.

15. The radio frequency transceiver device according to claim 10, wherein the third matching circuit further comprises:
a capacitor coupled to the antenna unit and a ground; and
an inductor pair comprising a fourth inductor and a fifth inductor, wherein the fourth inductor is shunted with the capacitor and coupled to the antenna unit and the ground, and the fifth inductor is coupled to the transmitter circuit and the first transformer coil of the auxiliary circuit.

* * * * *